United States Patent
D'Eliseo et al.

(10) Patent No.: US 11,663,120 B2
(45) Date of Patent: *May 30, 2023

(54) CONTROLLING NAND OPERATION LATENCY

(71) Applicant: Micron Technology, Inc., Boise, ID (US)

(72) Inventors: Giuseppe D'Eliseo, Caserta (IT); Luigi Esposito, Piano di Sorrento (IT); Xinghui Duan, Shanghai (CN); Lucia Santojanni, Naples (IT); Massimo Iaculo, San Marco Evangelista (IT)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/521,340

(22) Filed: Nov. 8, 2021

(65) Prior Publication Data

US 2022/0066926 A1 Mar. 3, 2022

Related U.S. Application Data

(63) Continuation of application No. 16/742,215, filed on Jan. 14, 2020, now Pat. No. 11,169,917, which is a
(Continued)

(51) Int. Cl.
*G06F 12/02* (2006.01)
*G11C 16/10* (2006.01)

(52) U.S. Cl.
CPC ...... *G06F 12/0246* (2013.01); *G06F 12/0253* (2013.01); *G06F 12/0292* (2013.01);
(Continued)

(58) Field of Classification Search
None
See application file for complete search history.

(56) References Cited

U.S. PATENT DOCUMENTS 10,552,316 B2 2/2020 D'Eliseo et al.
11,169,917 B2 11/2021 D'eliseo et al.
(Continued)

FOREIGN PATENT DOCUMENTS

CN 112470132 A 3/2021
JP 2011192260 9/2011
(Continued)

OTHER PUBLICATIONS

"European Application Serial No. 19825721.4, Response filed Aug. 9, 2021 to Communication pursuant to Rules 161(2) and 162 EPC dated Feb. 5, 2021", 12 pgs.
(Continued)

*Primary Examiner* — Tracy C Chan
(74) *Attorney, Agent, or Firm* — Schwegman Lundberg & Woessner, P.A.

(57) ABSTRACT

Devices and techniques for controlling NAND operation latency are described herein. A controlled can receive a write request. The controller can then calculate a number of garbage collection operations to perform on a physical block that is closed. Here, the calculation includes adding a logical-to-physical (L2P) region search ratio to a cadence calculation for garbage collection. Garbage collection operations can be performed on the physical block in accordance with the calculated number of garbage collection operations to perform. Then, the controller can perform the write request in response to completing the calculated number of garbage collection operations.

20 Claims, 7 Drawing Sheets

Related U.S. Application Data continuation of application No. 16/024,380, filed on Jun. 29, 2018, now Pat. No. 10,552,316.

(52) U.S. Cl.
CPC ...... *G11C 16/10* (2013.01); *G06F 2212/7201* (2013.01); *G06F 2212/7205* (2013.01)

(56) References Cited

U.S. PATENT DOCUMENTS

| | | | |
|---|---|---|---|
| 2011/0202578 A1* | 8/2011 | Asano | G06F 12/0246 707/813 |
| 2013/0173875 A1 | 7/2013 | Kim et al. | |
| 2014/0281172 A1 | 9/2014 | Seo et al. | |
| 2016/0027518 A1* | 1/2016 | Zettsu | G06F 13/161 365/185.12 |
| 2016/0232088 A1* | 8/2016 | Mohan | G06F 12/0246 |
| 2016/0335179 A1 | 11/2016 | Lee et al. | |
| 2016/0350027 A1 | 12/2016 | Kandiraju et al. | |
| 2017/0123972 A1 | 5/2017 | Gopinath et al. | |
| 2017/0300410 A1 | 10/2017 | Zhang et al. | |
| 2017/0351604 A1* | 12/2017 | Tang | G06F 3/0679 |
| 2018/0004420 A1 | 1/2018 | Jung et al. | |
| 2018/0024920 A1* | 1/2018 | Thomas | G06F 12/0246 711/103 |
| 2018/0059977 A1 | 3/2018 | Matsuyama et al. | |
| 2019/0114272 A1* | 4/2019 | Dubey | G06F 12/0246 |
| 2019/0258405 A1* | 8/2019 | Jung | G06F 3/0604 |
| 2020/0004673 A1 | 1/2020 | D'eliseo et al. | |
| 2020/0226059 A1 | 7/2020 | D'eliseo et al. | |

FOREIGN PATENT DOCUMENTS

| | | |
|---|---|---|
| WO | WO-2014110095 A1 | 7/2014 |
| WO | 2014147768 | 9/2014 |
| WO | WO-2020005714 A1 | 1/2020 |

OTHER PUBLICATIONS

"International Application Serial No. PCT/US2019/038262, International Preliminary Report on Patentability dated Jan. 7, 2021", 6 pgs.

"International Application Serial No. PCT/US2019/038262, International Search Report dated Oct. 8, 2019", 3 pgs.

"International Application Serial No. PCT/US2019/038262, Written Opinion dated Oct. 8, 2019", 4 pgs.

U.S. Appl. No. 16/024,380, Notice of Allowance dated Sep. 5, 2019, 15 pgs.

U.S. Appl. No. 16/024,380, Notice of Allowability dated Dec. 11, 2019.

U.S. Appl. No. 16/742,215, Preliminary Amendment filed Apr. 3, 2020, 7 pgs.

U.S. Appl. No. 16/742,215, Non Final Office Action dated Dec. 24, 2020, 7 pgs.

U.S. Appl. No. 16/742,215, Response filed Mar. 24, 2021 to Non Final Office Action dated Dec. 24, 2020, 10 pgs.

U.S. Appl. No. 16/742,215, Final Office Action dated Mar. 31, 2021, 8 pgs.

U.S. Appl. No. 16/742,215, Response filed Jun. 1, 2021 to Final Office Action dated Mar. 31, 2021, 11 pgs.

U.S. Appl. No. 16/742,215, Advisory Action dated Jun. 15, 2021, 4 pgs.

U.S. Appl. No. 16/742,215, Notice of Allowance dated Jul. 12, 2021, 9 pgs.

"European Application Serial No. 19825721.4, Extended European Search Report dated Mar. 1, 2022", 9 pgs.

"Japanese Application Serial No. 2020-572977, Notification of Reasons for Refusal dated Mar. 22, 2022", w English translation, 19 pgs.

"Japanese Application Serial No. 2020-572977, Response filed Jun. 14, 2022 to Notification of Reasons for Refusal dated Mar. 22, 2022", w/ English claims, 10 pgs.

U.S. Appl. No. 16/025,380, filed Jun. 29, 2018, U.S. Appl. No. 10/552,316, Controlling Nand Operation Latency.

U.S. Appl. No. 16/742,215, filed Jan. 14, 2020, U.S. Appl. No. 11/169,917, Controlling Nand Operation Latency.

"Korean Application Serial No. 10-2021-7002653, Notice of Preliminary Rejection dated Feb. 24, 2023", with WIPO machine English translation, 14 pages.

* cited by examiner

CONTROLLING NAND OPERATION LATENCY

PRIORITY APPLICATION

This application is a continuation of U.S. application Ser. No. 16/742,215, filed Jan. 14, 2020, which is a continuation of U.S. application Ser. No. 16/024,380, filed Jun. 29, 2018, now issued as U.S. Pat. No. 10,552,316, all of which are incorporated herein by reference in their entirety.

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data.

However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) can extend adjacent a string of storage cells to form a channel for the storages cells of the string. In the example of a vertical string, the polysilicon structure can be in the form of a vertically extending pillar. In some examples the string can be "folded," and thus arranged relative to a U-shaped pillar. In other examples, multiple vertical structures can be stacked upon one another to form stacked arrays of storage cell strings.

Memory arrays or devices can be combined together to form a storage volume of a memory system, such as a solid-state drive (SSD), a Universal Flash Storage (UFS "M) device, a MultiMediaCard (MMC) solid-state storage device, an embedded MMC device (eMMC"), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs can include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various embodiments discussed in the present document.

DETAILED DESCRIPTION

Figure 1:
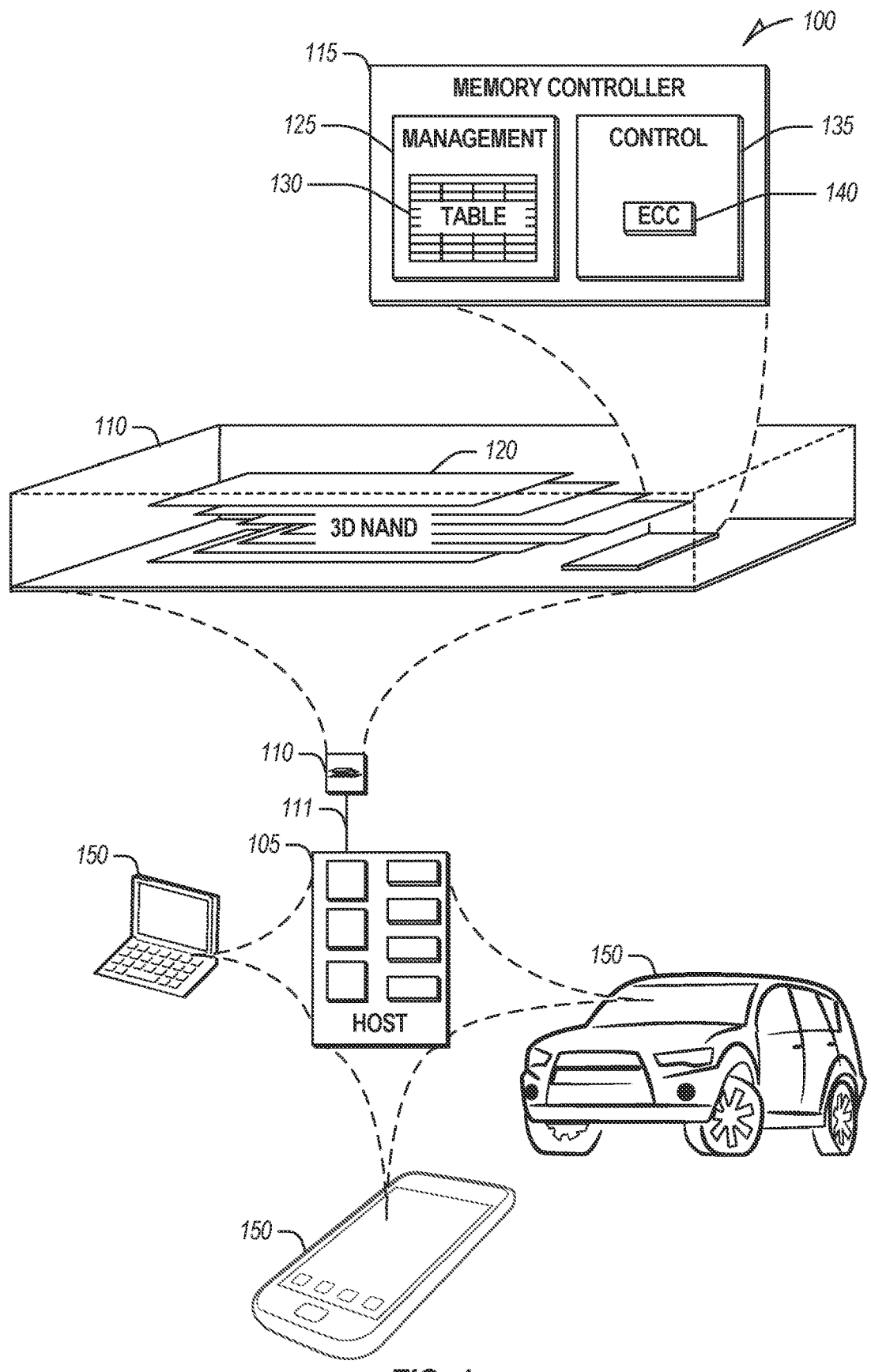
FIG. 1 illustrates an example of an environment including a memory device.

Many storage devices, such as flash devices, use translation tables to map logical elements (e.g., pages or blocks) to the physical equivalents of the logical elements. This allows the controller of the device to perform a variety of technique to increase the performance of, or longevity of, the storage elements of the device. For example, NAND flash cells experience physical wear with write or erase cycles. Further, these devices require many elements to be erased at one time (e.g., block erasure). To address these issues, the controller generally spreads writes around available cells (e.g., to reduce wearing out of these cells) and migrates good pages from blocks to erase the block and thus free additional space. In both cases, a host address for a given page or block can be constant even though the data to which it refers is moved to different physical pages or blocks by virtue of the translation table.

Translation tables are generally loaded into an internal memory of the controller (e.g., a working memory). If the table size is greater than the working memory (e.g., in random access memory (RAM), such as dynamic RAM (DRAM) or static RAM (SRAM) of the controller, a portion of the table is loaded into the working memory and the remainder of the table is stored in other storage (such as NAND flash array elements). If a translation request (e.g., a logical-to-physical (L2P) mapping) is not in the working memory, the controller replaces the internal memory portion of the table with the appropriate portion from other storage. This process can increase latencies when performing operations such as reading or writing to the storage device. Although increased working memory can reduce these occurrences, this comes at a manufacturing and power cost that can be unacceptable for a given application.

When performing certain maintenance tasks, such as garbage collection (GC), the fragmented nature of L2P tables can become an issue. For example, NAND devices typically allow single page writes but erasure is performed at the block level (e.g., a block is the smallest unit of the NAND device that can be individually erased). Garbage collection is designed to recover free space when the free physical space in the NAND devices gets low. Garbage collection generally involves copying logical valid pages from a source block to a destination block and then erasing the source block to free the space. To accomplish the copying, the L2P table is traditionally searched to identify valid pages of the source block by looking for physical addresses that refer to the source block.

The traditional approach to garbage collection when the complete L2P table cannot fit within working memory has some problems. For example, the search can be time consuming because each L2P region is retrieved from the slower NAND storage and placed into working memory to conduct the search. When an L2P region contains no physical pages in the block, the entire load and search time is wasted. This results in high latencies while the device waits for the garbage collection process to complete.

A data structure can be maintained for a block to increase the speed with which garbage collection proceeds. The data structure indicates which L2P table regions are pertinent to a given block. For example, when a page is written to a block, the corresponding data structure is modified to indicate the L2P region that maps the logical page to that physical page. When garbage collection is initiated on the block, the device then loads the data structure and searches the indicated L2P table regions. This process limits the L2P regions loaded into working memory to only those regions that are likely to include references to the block.

An implementation of the data structure can include a bitmap (e.g., a binary array), referred to herein as a map bitmap (e.g., MBM), in which an index corresponds to an L2P table region and the value (e.g., a binary '1' versus a binary '0') at the index indicates whether the L2P region holds (or held) a reference to a physical page of the block. In this example, when a block is erased, the related bitmap is fully reset (e.g., all values are set to binary '0'). When a page belonging to a L2P region is written to the block (e.g., for either host write or garbage collection procedure), the related bit in the bitmap is set (e.g., to binary '1'). In an example, after the block is fully written—that is, there are no more free pages—the bitmap for the block is not changed until the block is erased.

The data structure use described above provides several advantages to traditional block management. For example, fewer L2P regions are loaded into working memory, reducing the time to perform valid page searches within the block. Further, the efficiency of the search is increased as each L2P region loaded into working memory is likely to yield a valid page that will be moved during the operation. Additionally, because the data structure is updated as part of a write to a block, there is very little maintenance overhead in maintaining the structure.

An issue that can arise using the data structure to select which L2P regions to search during maintenance involves a possibly decreased efficiency of the data structure over time. Because the data structure does not change once the block is closed, as more data is deleted or overwritten in the block, the more stale the data structure becomes—e.g., the more previous valid entries in the data structure are no longer valid as those logical blocks now point to different blocks. If many of the data structure entries are stale, then the garbage collection process can again become inefficient, such as by increasing host write latencies.

To address the stale data structure issue, garbage collection cadence can be modified by the data structure entries to spread out the latency caused by stale data structure entries across several host writes. In general, to control latency issues, garbage collection can be split across operations, such as host writes. This splitting, or determination of how much work to do for one such operation, is called the cadence for the garbage collection. The cadence ratio can be expressed as $$C = \frac{GCW}{HW},$$

where C is the cadence, GCW (e.g., number of garbage collection writes) is the number of pages to re-copy to a new block to free this block during garbage collection, and HW (e.g., host writes) is a fixed value. HW is set to indicate the amount of host data written that corresponds to a complete garbage collection run. For example, if it takes nine garbage collection writes to free the block, and the block should be freed after one megabyte (1 mb) of host data is written to the memory device, them the cadence is $$\frac{9_w}{1_{mb}} \cong \frac{1_w}{111.12_{kb}},$$

or one garbage collection write for every 111.12 kilobytes (kb) of host data that is written.

The cadence can be more effectively calculated by tracking how many L2P regions are involved with a given block. This tracking can be accomplished by an array of counters where the index corresponds to the block (e.g., index 1 corresponds to block 1) and the value at the index is the count of L2P regions; although other tracking structures can be used. The count in the tracking data structure is equivalent to the number of 1's in an MBM for the given block. Thus, the maximum value for the count is equal to the number of L2P regions.

Using this information, the cadence can be calculated as:

$$C = \frac{GCW_i + \frac{L2PC[i]}{L2PLoadThr}}{HW}$$

Where, L2PC[i] is the value at index i—which corresponds to block i—in the array of counters, and L2PLoadThr is a threshold value of the maximum number of L2P regions to load in a single garbage collection operation. L2PLoadThr can be set to achieve a desired host latency for operations. Thus, as modified by the new cadence calculation, the garbage collection is suspended when: 1) A predetermined number of garbage collection writes has been collected and loaded (e.g., in a cache) and are ready to write to a new block; or 2) the number of L2P regions loaded searching for valid pages exceeds L2PLoadThr. At the suspension, the buffer is flushed (e.g., pages are written to the new block) and freed, for example, to accept host write data. By limiting the garbage collection in this manner, host latencies are reduced while the device is able to keep up with garbage collection (e.g., the garbage collection is able to complete). Additional details and examples are described below.

FIG. 1 illustrates an example of an environment 100 including a host device 105 and a memory device 110 configured to communicate over a communication interface. The host device 105 or the memory device 110 can be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105. In these examples, the memory device 110 communicates with host device 105 components via an interlink 111, such as a bus. Thus, as described herein, a host, or host device 105 operation is distinct from those of the memory device 110, even when the memory device 110 is integrated into the host device 105.

One or more communication interfaces (e.g., interlink 111) can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host 105 can be a machine having some portion, or all, of the components discussed in reference to the machine 700 of FIG. 7.

The memory controller 115 can receive instructions from the host 105, and can communicate with the memory array 120, such as to transfer data to (e.g., write or erase) or from (e.g., read) one or more of the memory cells, planes, sub-blocks, blocks, or pages of the memory array 120. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory can have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things. In an example, the management tables 103 can include translation tables or a L2P mapping.

The memory manager 125 can implement and use data structures to reduce memory device 110 latency in operations that involve searching L2P tables for valid pages, such as garbage collection. To this end, the memory manager 125 is arranged to maintain a data structure (e.g., table region data structure, tracking data structure, etc.) for a physical block. The data structure includes indications of L2P mapping table regions, of the L2P table. In an example, the L2P table is larger than a working memory for the memory manager 125, which can be shared with the memory controller 115 or other components of the memory device 110. The L2P table regions are, however, not larger than the working memory, permitting the L2P regions to be loaded into the working memory and operated upon.

To efficiently manage the data structure, the memory manager 125 performs maintenance operations on the data structure when data is written. Thus, the memory controller 115 is arranged to receive a write request (e.g., from the host 105) that includes a logical page and data to be written at the logical page. The memory manager 125 is arranged to establish (e.g., update or create) an entry in the L2P table between the logical page and a physical page of a physical block of the NAND device to which the data is written. Here, when the L2P table is greater than working memory, the entry is within a region, of multiple regions that span (e.g., completely cover) the L2P table.

The memory manager 125 is arranged to write an indication of the region to the data structure corresponding to the physical block of the write request. In an example, the data structure is written in the physical block. In an example, the data structure is written to a maintenance area of the array 120 that is separate from the block. Although it is efficient to have the memory manager 125 write the indication because the memory manager also selected the L2P table region for the write, other entities, such as the memory controller 115, can also perform the write.

In an example, the data structure is a bitmap (e.g., a binary array). In an example, the bitmap includes a bit for each region of multiple, mutually exclusive, regions that span the L2P table. Thus, L2P table regions do not overlap with each other and the combination of all L2P table regions span the entire L2P table. The bitmap includes a bit for each of these regions. In an example, L2P table regions are ordered and an index of the bit corresponds to an order of a given L2P table region. For example, if there are two L2P table regions for the L2P table, one covering the first half of the L2P table and one covering a second half of the L2P table, then index '0' of the bitmap corresponds to the first region and index '1' of the bitmap corresponds to the second region. There is no requirement, however, that the regions cover contiguous portions of the L2P table (e.g., region A can not be next to region B in the table), nor that they have a particular order. However, whatever criteria used to assign a given L2P table region to a given index of the bitmap must be consistent (e.g., region 'Y' always maps to the same index). In an example, the L2P table region indications in the bitmap (e.g., to indicate that a given L2P table region has, at one time, a physical page in the block) are a logical one (e.g., binary '1') in a respective bit of that region.

In an example, the memory manager 125 is arranged to read the data structure during a garbage collection operation of the physical block to load a limited set of regions of the L2P table into a working memory. The memory manager 125 searches this limited set of regions to find and move valid pages from the block to another block. Once the valid pages are moved, the block is erased to complete the garbage collection. In an example, no regions of the multiple regions that are not in the limited set of regions are used in the garbage collection.

In an example, the memory manager 125 is arranged to initialize the data structure in response to erasing the physical block. Thus, once the garbage collection is complete, the data structure for the block is set to a known, empty, state. In an example, where the data structure is a bitmap, the data structure is initialized by writing logical zeros (e.g., binary '0') in each bit of the bitmap. In an example, the indication is unset only with the initializing. This restriction helps to reduce maintenance requirements and increase predictability for other components. Thus, when a block is fully written, the data structure will not change until the block is erased and the data structure is initialized. Also, once an L2P region is indicated in the data structure, it can not be "un-indicated" until the initialization.

To control operational latency (e.g., host write latency), the memory manager 125 is arranged to maintain a tracking data structure. In an example, the tracking data structure is an array, where indices of the array correspond to blocks, and values of the array correspond to the number of L2P regions from the L2P table have logical address that point to the block indicated by the index. In an example, the memory manager 125 maintains the tracking data structure in memory (e.g., it is not written to the array 120).

The memory manager 125 is arranged to calculate the number of operations to perform when garbage collection is operating. Thus, while garbage collection for a given block involves moving all the valid pages to a new block, the garbage collection can be interrupted (e.g., suspended), and thus operating over several intervals. The calculated number of garbage collection operations are the number of operations to perform in one of these intervals.

In an example, the calculation includes adding an L2P region search ratio to a cadence calculation for garbage collection. As noted above, the cadence is a ration of how many garbage collection operations to perform given a certain amount of data being written by the host 105. The L2P region search ratio also limits how many L2P regions are involved in searching for valid pages on the block. In an example, adding the L2P region search ratio to the cadence calculation includes adding the L2P region search ratio to the garbage collection writes. In an example, the L2P region search ratio has a numerator equal to a count of entries in a block data structure, the entries each indicating a logical page correspondence to the physical block. In an example, the L2P region search ratio has a denominator equal to a load-threshold parameter. These examples can be expressed as:

$$GCW_i + \frac{L2PC[i]}{\frac{L2PLoadThr}{HW}}$$

Where, L2PC[i] is the value at index i—which corresponds to block i—in the array of counters, and L2PLoadThr is a threshold value of the maximum number of L2P regions to load in a single garbage collection operation.

In an example, the memory manager 125 is arranged to suspend garbage collection in response to the count of entries in the block data structure being greater than the load-threshold parameter. At this suspension, the garbage collection buffer can be flushed to the array 120, and a new host write is loaded into the buffer to be written to the array 120.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, can be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB can include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or can require different amounts of metadata associated therewith. For example, different memory device types can have different bit error rates, which can lead to different amounts of metadata necessary to ensure integrity of the page of data (e.g., a memory device with a higher bit error rate can require more bytes of error correction code data than a memory device with a lower bit error rate). As an example, a multi-level cell (MLC) NAND flash device can have a higher bit error rate than a corresponding single-level cell (SLC) NAND flash device. As such, the MLC device can require more metadata bytes for error data than the corresponding SLC device.

Figure 2:
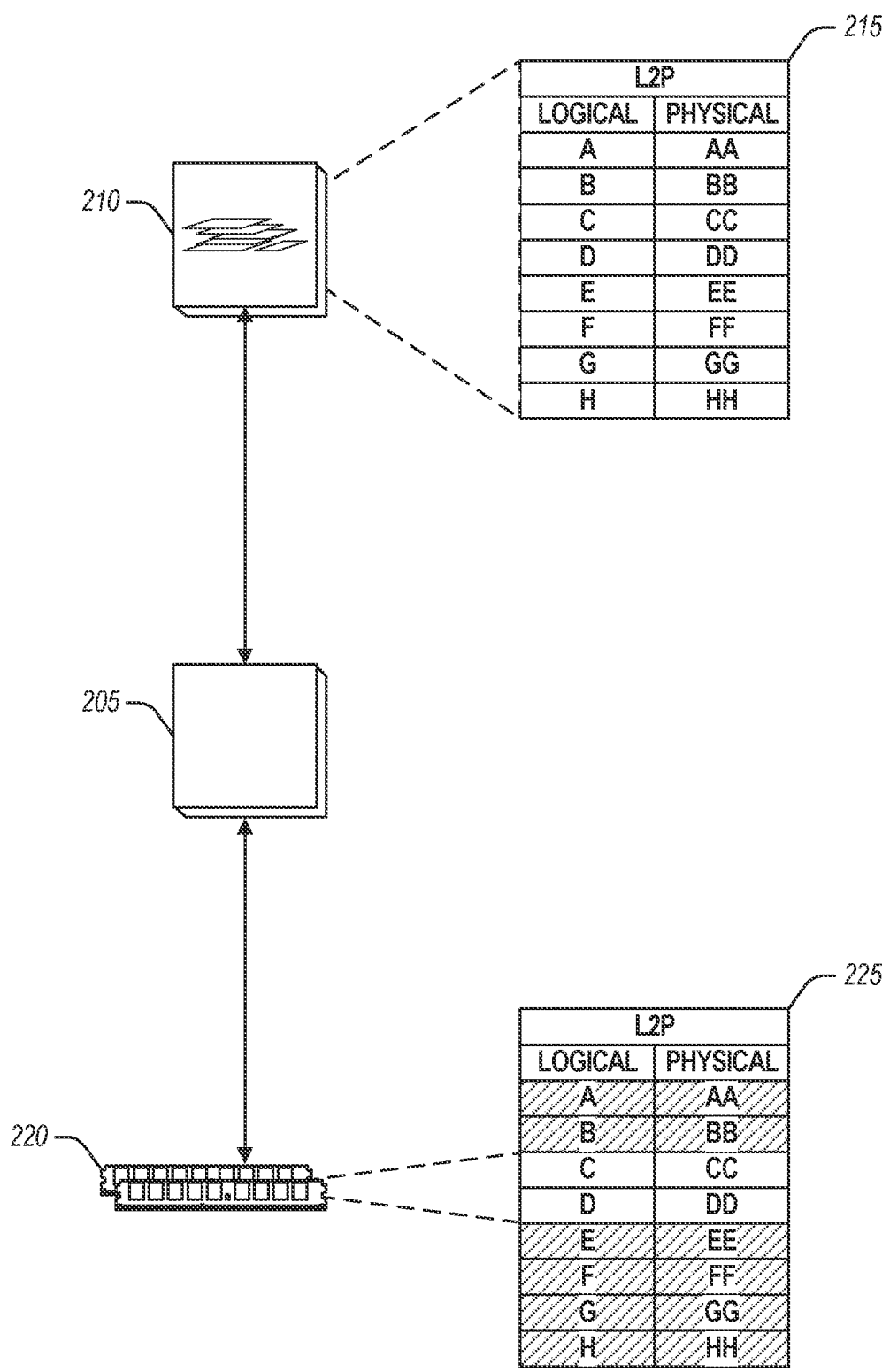
FIG. 2 illustrates an example of a logical-to-physical table region in working memory.

FIG. 2 illustrates an example of a logical-to-physical table region 225 in working memory 220. The complete L2P table 215 is stored in the NAND array 210. The complete L2P table, however, does not fit within the working memory 220. Thus, when searching the L2P table 215, processing circuitry 205 (e.g., a memory manager, memory controller, etc.) loads the L2P table region 225 from the array 210 into the working memory.

Figure 3:
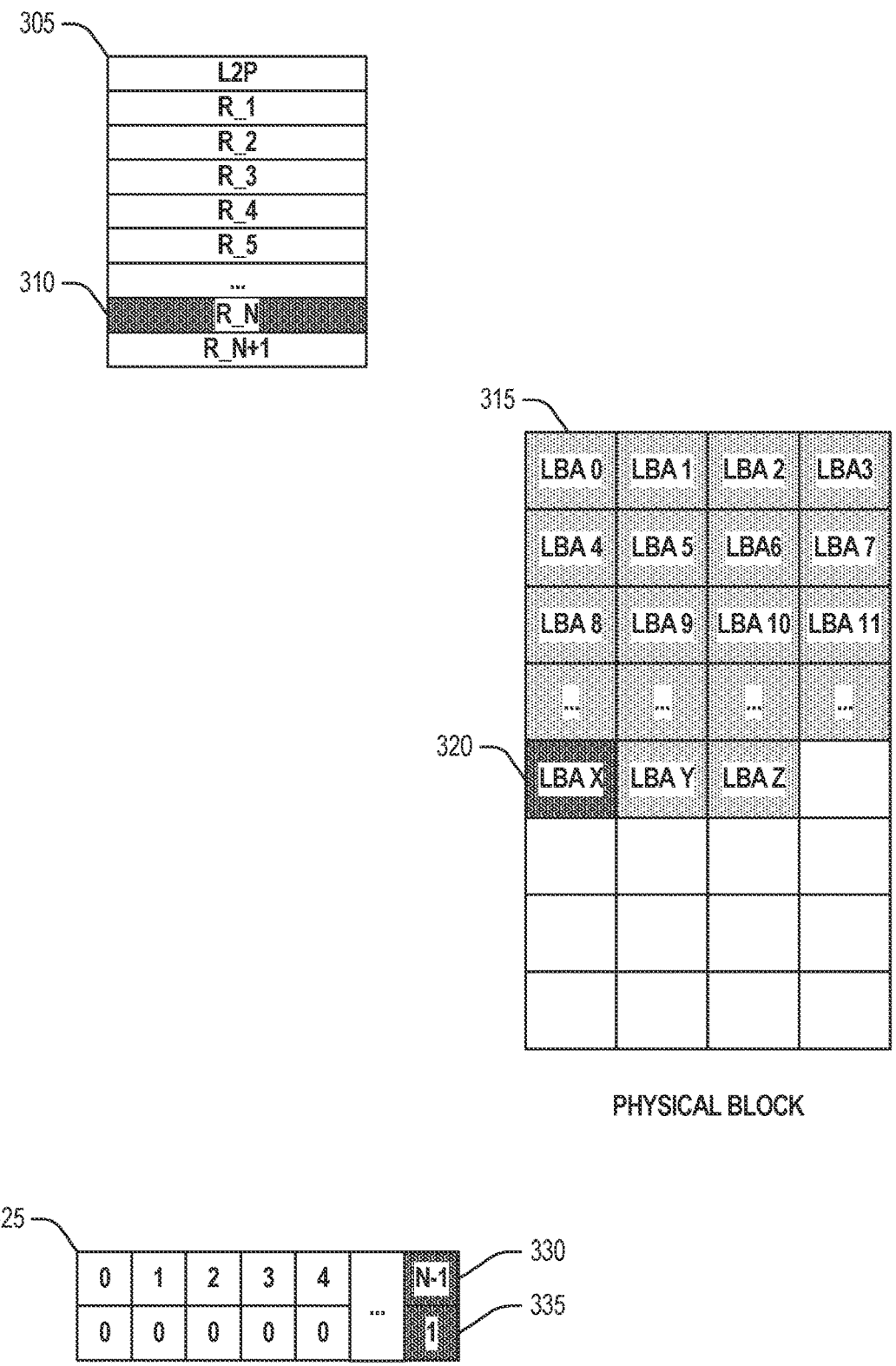
FIG. 3 illustrates an example of a relationship between a logical-to-physical region, a physical block, and a tracking data structure.

FIG. 3 illustrates an example of a relationship between a logical-to-physical region 310, a physical block 315, and a tracking data structure 325. Here, the tracking data structure is organized as a binary array with indices beginning at zero. Thus, the element of the array corresponding to a given table region (e.g., region two) is the region minus one (e.g., index one of the tracking data structure 325 corresponds to region two). Each index in the data structure 325 uniquely corresponds to a single table region in the L2P table 305. Although the bitmap or binary array structure is offered as a possible implementation of the tracking data structure, other structures can be used, such as a structured data file (e.g., extensible markup language (XML) or the like), a database, etc. Moreover, the indications can include characters or other symbols.

The relationship between these entities can be established during a host (or other) write to the block 315. The L2P table 305 is segmented into regions, including region N 310. The logical to physical page relationship is stored in region N 310. The physical page 320 in the block 315 is used to store the data for the write. The index N−1 330 corresponds to the region N 310. Thus, the array element 335 is updated to a binary '1' to indicate that the region N 310 has a relationship that pertains to the block 315; a binary '0' indicates that a corresponding region does not have a relationship that pertains to the block 315. If the block 315 fills, or closes (e.g., there are no more free pages in which to write a new request), the data structure 325 is no longer updated.

Figure 4:
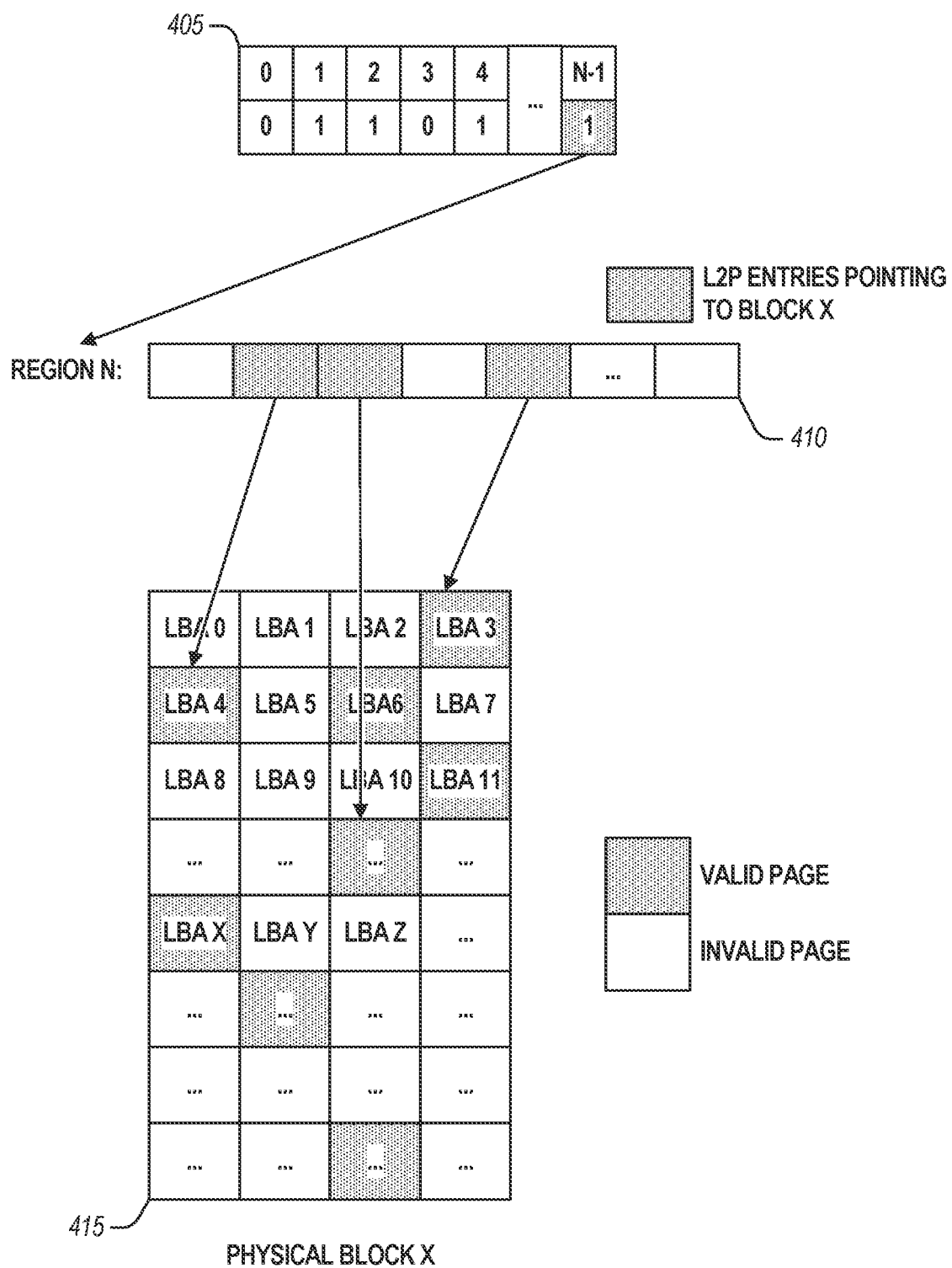
FIG. 4 illustrates an example of a relationship between a logical-to-physical region, a physical block, and a tracking data structure.

FIG. 4 illustrates an example of a relationship between a logical-to-physical region 410, a physical block X 415, and a tracking data structure 405 for block X.

Here, the tracking data structure 405 is populated with indications of L2P table regions that pertain to block X 415. During garbage collection for block X 415, the tracking data structure 405 is read to determine which L2P table regions to load into working memory to complete the garbage collection. Here, the tracking data structure indicates that region N 410 has entries pertaining to block X 415. Thus, region N can be loaded into non-volatile storage.

Once loaded into working memory, the region N 410 is searched for entries that point to block X 415, such as LBA 4 and LBA 3, among others. These pages are then written to a different block and marked invalid with respect to block X 415. This process is repeated until all valid pages in block X 415 are moved, leaving block X 415 with no valid data. Block X 415 can then be erased, completing the garbage collection of block X. As noted above, the tracking data structure 405 reduces the number of L2P table regions that need to be loaded into working memory to complete the garbage collection process over traditional approaches.

Figure 5A:
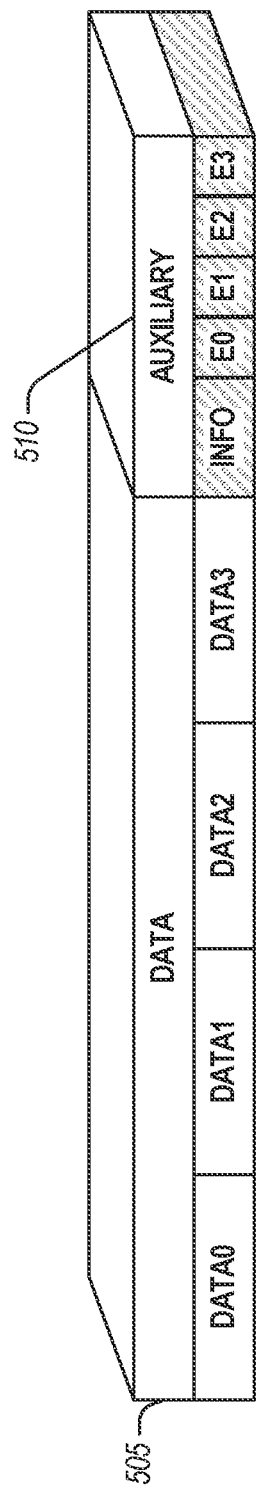
FIGS. 5A-5B illustrate storage configurations for a tracking data structure.
Figure 5B:
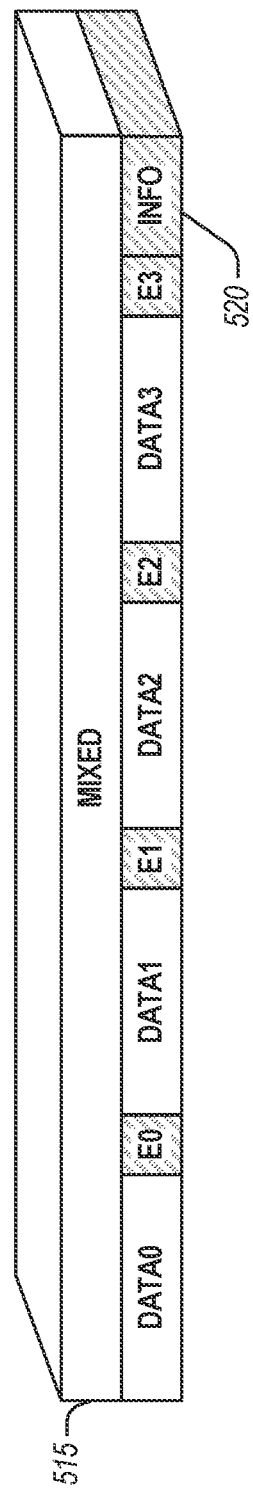

FIGS. 5A-5B illustrate storage configurations for a verification component in a block. FIG. 5A illustrates an organization where a dedicated portion of the block is set-aside for controller metadata. Thus, the block is divided in the user data portion 505 and the auxiliary portion 510. The data structure for table region tracking can be stored in the auxiliary portion, such as in the segment marked "INFO." In contrast, FIG. 5B illustrates an alternative organization in which the auxiliary portions are interspersed throughout the user data segments, resulting in a heterogeneous portion 515. However, the "INFO" auxiliary portions 520 are still located on the block and can store the data structure of the block when it was last written. Other locations that can be used to store data structures include areas of the memory device reserved for device management.

Figure 6:
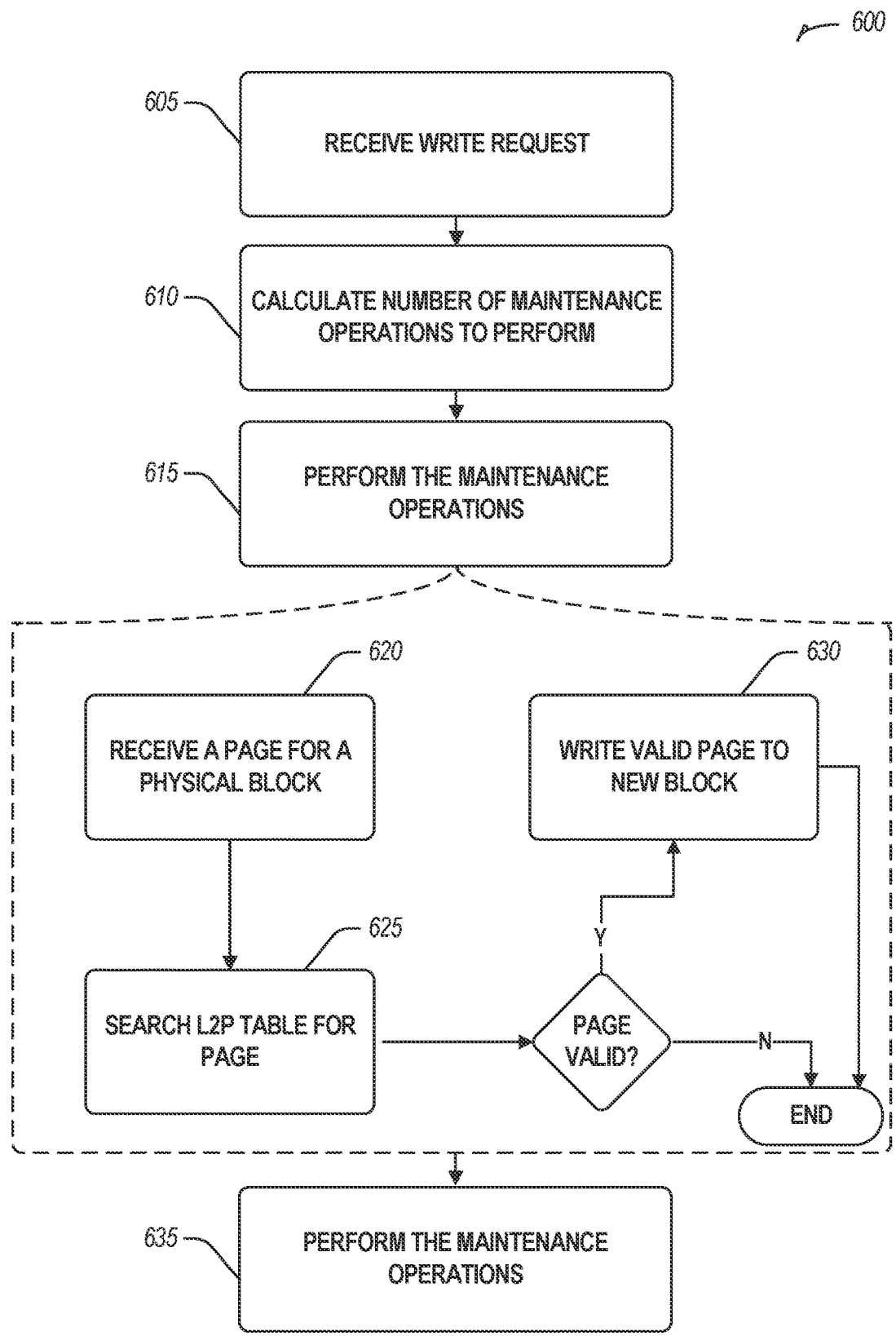
FIG. 6 illustrates a flowchart of a method for controlling NAND operation latency.

FIG. 6 illustrates a flowchart of a method 600 for controlling NAND operation latency. Operations of the method 600 are performed by electronic hardware, such as that described herein (e.g., circuitry).

At operation 605, a write request is received at a controller of a NAND device.

At operation 610, the number of garbage collection operations to perform on a physical block that is closed are calculated. In an example, the cadence calculation is a ratio between garbage collection writes and host writes. In an example, the garbage collection writes are a count of garbage collection operations to move every valid page from the physical block to the new physical block and the host writes is a parameter that defines a count of host writes over which to spread the garbage collection writes. In an example, the calculation includes adding an L2P region search ratio to a cadence calculation for garbage collection. In an example, adding the L2P region search ratio to the cadence calculation includes adding the L2P region search ratio to the garbage collection writes. In an example, the L2P region search ratio has a numerator equal to a count of entries in a block data structure, the entries each indicating a logical page correspondence to the physical block. In an example, the L2P region search ratio has a denominator equal to a load-threshold parameter.

In an example, the operations of the method 600 also include receiving a second write request, suspending garbage collection operation searching in response to the count of entries in the block data structure being greater than the load-threshold parameter, and performing the second write request.

At operation 615, the garbage collection operations are performed on the physical block. In an example, each garbage collection operation includes operations 620-625 for a given page in the physical block.

At operation 625, the L2P table is searched to determine whether the page is valid. In an example, the searching is directed by the block data structure that includes an entry for each L2P table region. In an example, the block data structure is a bit map. In an example, an entry in the block data structure is a single bit. In an example, a logical one in an entry indicates that an L2P region corresponding to a position of the bit includes a logical page that corresponded to the physical block. In an example, the block data structure is written in the physical block.

In an example, the NAND device includes a working memory/In an example, the L2P table is larger than the working memory. In an example, an L2P region is not larger than the working memory. In an example, searching the L2P table (operation 625) includes loading an L2P region into the working memory in response to a corresponding entry in the block data structure that indicates a logical page corresponded to the physical block.

At operation 630, the page is written to a new physical block in response to the page being valid.

At operation 635, the write request is performed in response to completing writing the page to the new physical block.

In an example, the operations of the method 600 can be extended to include receiving a second write request, suspending garbage collection operation searching in response to a threshold number of garbage collection operations having been performed on the physical block in a garbage collection cycle, and performing the second write request.

Figure 7:
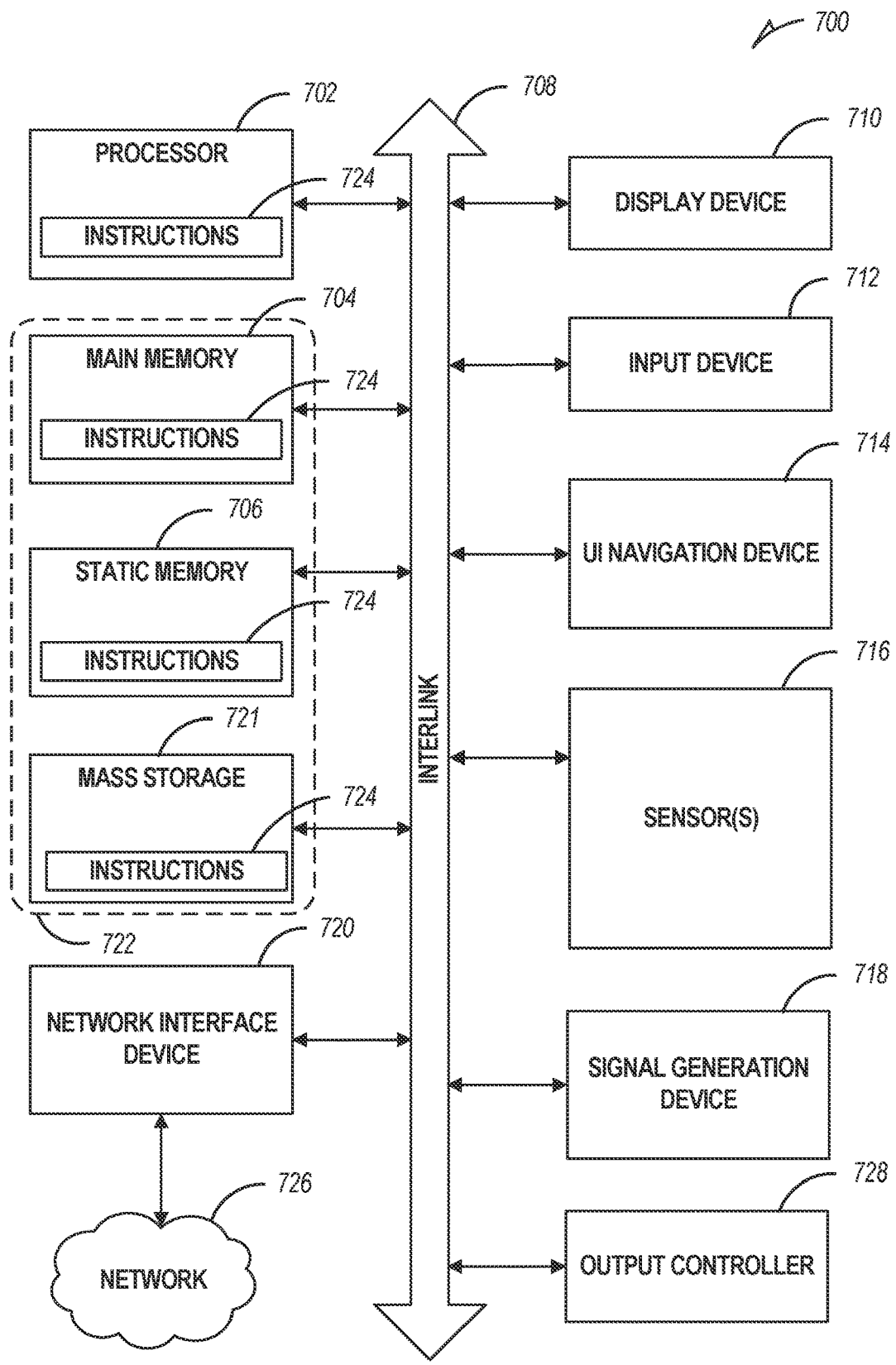
FIG. 7 is a block diagram illustrating an example of a machine upon which one or more embodiments can be implemented.

FIG. 7 illustrates a block diagram of an example machine 700 upon which any one or more of the techniques (e.g., methodologies) discussed herein can perform. In alternative embodiments, the machine 700 can operate as a standalone device or can be connected (e.g., networked) to other machines. In a networked deployment, the machine 700 can operate in the capacity of a server machine, a client machine, or both in server-client network environments. In an example, the machine 700 can act as a peer machine in peer-to-peer (P2P) (or other distributed) network environment. The machine 700 can be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, can include, or can operate by, logic, components, devices, packages, or mechanisms. Circuitry is a collection (e.g., set) of circuits implemented in tangible entities that include hardware (e.g., simple circuits, gates, logic, etc.). Circuitry membership can be flexible over time and underlying hardware variability. Circuitries include members that can, alone or in combination, perform specific tasks when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time.

The machine (e.g., computer system) 700 (e.g., the host device 105, the memory device 110, etc.) can include a hardware processor 702 (e.g., a central processing unit (CPU), a graphics processing unit (GPU), a hardware processor core, or any combination thereof, such as the memory controller 115, etc.), a main memory 704 and a static memory 706, some or all of which can communicate with each other via an interlink (e.g., bus) 708. The machine 700 can further include a display unit 710, an alphanumeric input device 712 (e.g., a keyboard), and a user interface (UI) navigation device 714 (e.g., a mouse). In an example, the display unit 710, input device 712 and UI navigation device 714 can be a touch screen display. The machine 700 can additionally include a storage device (e.g., drive unit) 716, a signal generation device 718 (e.g., a speaker), a network interface device 720, and one or more sensors 716, such as a global positioning system (GPS) sensor, compass, accelerometer, or other sensor. The machine 700 can include an output controller 728, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 716 can include a machine readable medium 722 on which is stored one or more sets of data structures or instructions 724 (e.g., software) embodying or utilized by any one or more of the techniques or functions described herein. The instructions 724 can also reside, completely or at least partially, within the main memory 704, within static memory 706, or within the hardware processor 702 during execution thereof by the machine 700. In an example, one or any combination of the hardware processor 702, the main memory 704, the static memory 706, or the storage device 716 can constitute the machine readable medium 722.

While the machine readable medium 722 is illustrated as a single medium, the term "machine readable medium" can include a single medium or multiple media (e.g., a centralized or distributed database, or associated caches and servers) configured to store the one or more instructions 724.

The term "machine readable medium" can include any medium that is capable of storing, encoding, or carrying instructions for execution by the machine 700 and that cause the machine 700 to perform any one or more of the techniques of the present disclosure, or that is capable of storing, encoding or carrying data structures used by or associated with such instructions. Non-limiting machine readable medium examples can include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media can include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 724 (e.g., software, programs, an operating system (OS), etc.) or other data are stored on the storage device 721, can be accessed by the memory 704 for use by the processor 702. The memory 704 (e.g., DRAM) is typically fast, but volatile, and thus a different type of storage than the storage device 721 (e.g., an SSD), which is suitable for long-term storage, including while in an "off" condition. The instructions 724 or data in use by a user or the machine 700 are typically loaded in the memory 704 for use by the processor 702. When the memory 704 is full, virtual space from the storage device 721 can be allocated to supplement the memory 704; however, because the storage 721 device is typically slower than the memory 704, and write speeds are typically at least twice as slow as read speeds, use of virtual memory can greatly reduce user experience due to storage device latency (in contrast to the memory 704, e.g., DRAM). Further, use of the storage device 721 for virtual memory can greatly reduce the usable lifespan of the storage device 721.

In contrast to virtual memory, virtual memory compression (e.g., the Linux® kernel feature "ZRAM") uses part of the memory as compressed block storage to avoid paging to the storage device 721. Paging takes place in the compressed block until it is necessary to write such data to the storage device 721. Virtual memory compression increases the usable size of memory 704, while reducing wear on the storage device 721.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 724 can further be transmitted or received over a communications network 726 using a transmission medium via the network interface device 720 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 720 can include one or more physical jacks (e.g., Ethernet, coaxial, or phone jacks) or one or more antennas to connect to the communications network 726. In an example, the network interface device 720 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 700, and includes digital or analog communications signals or other intangible medium to facilitate communication of such software.

ADDITIONAL EXAMPLES

Example 1 is a device for controlling NAND operation latency, the device comprising: a NAND array that includes several blocks, at least one physical block of the several physical blocks being closed; and a controller to: receive a write request; calculate a number of garbage collection operations to perform on the physical block that is closed, the calculation including addition of a logical-to-physical (L2P) region search ratio to a cadence calculation for garbage collection; perform the calculated number of garbage collection operations on the physical block, each garbage collection operation including, given a page in the physical block, the controller to: search an L2P table to determine whether the page is valid, the search directed by a block data structure that includes an entry for each L2P table region, the entry indicating whether a logical page in the L2P table region corresponded to the physical block; and write the page to a new physical block of the several blocks in response to the page being valid; and perform the write request in response to the calculated number of garbage collection operations being performed.

In Example 2, the subject matter of Example 1, wherein the L2P region search ratio has a numerator equal to a count of entries in the block data structure that indicate a logical page correspondence to the physical block.

In Example 3, the subject matter of Example 2, wherein the L2P region search ratio has a denominator equal to a load-threshold parameter.

In Example 4, the subject matter of Example 3, wherein the controller is arranged to: receive a second write request; suspend the garbage collection operations in response to the count of entries in the block data structure being greater than the load-threshold parameter; and perform the second write request.

In Example 5, the subject matter of Example 4, wherein, to add the L2P region search ratio to the cadence calculation, the controller adds the L2P region search ratio to the garbage collection writes.

In Example 6, the subject matter of any of Examples 1-5, wherein the controller is arranged to: receive a second write request; suspend the garbage collection operations in response to a threshold number of garbage collection operations having been performed on the physical block in a garbage collection cycle; and perform the second write request.

In Example 7, the subject matter of any of Examples 1-6, wherein the cadence calculation is a ratio between garbage collection writes and host writes, wherein the garbage collection writes are a count of garbage collection operations to move every valid page from the physical block to the new physical block, and wherein the host writes is a parameter that defines a count of host writes over which to spread the garbage collection writes.

In Example 8, the subject matter of any of Examples 1-7, wherein the block data structure is a bit map.

In Example 9, the subject matter of Example 8, wherein an entry in the data structure is a single bit.

In Example 10, the subject matter of Example 9, wherein a logical one in an entry indicates that an L2P region corresponding to a position of the bit includes a logical page that corresponded to the physical block.

In Example 11, the subject matter of any of Examples 1-10, wherein the data structure is written in the physical block.

In Example 12, the subject matter of any of Examples 1-11, wherein the device includes a working memory, wherein the L2P table is larger than the working memory, and wherein an L2P region is not larger than the working memory.

In Example 13, the subject matter of Example 12, wherein, to search the L2P table, the controller loads an L2P region into the working memory in response to a corresponding entry in the block data structure that indicates a logical page corresponded to the physical block.

Example 14 is a method for controlling NAND operation latency, the method comprising: receiving a write request at a controller of a NAND device; calculating a number of garbage collection operations to perform on a physical block that is closed, the calculating including adding a logical-to-physical (L2P) region search ratio to a cadence calculation for garbage collection; performing the calculated number of garbage collection operations on the physical block, each garbage collection operation including, given a page in the physical block: searching an L2P table to determine whether the page is valid, the searching directed by a block data structure that includes an entry for each L2P table region, the entry indicating whether a logical page in the L2P table region corresponded to the physical block; and writing the page to a new physical block in response to the page being valid; and performing the write request in response to the calculated number of garbage collection operations being performed.

In Example 15, the subject matter of Example 14, wherein the L2P region search ratio has a numerator equal to a count of entries in the block data structure that indicate a logical page correspondence to the physical block.

In Example 16, the subject matter of Example 15, wherein the L2P region search ratio has a denominator equal to a load-threshold parameter.

In Example 17, the subject matter of Example 16, comprising: receiving a second write request; suspending the garbage collection operations in response to the count of entries in the block data structure being greater than the load-threshold parameter; and performing the second write request.

In Example 18, the subject matter of Example 17, wherein adding the L2P region search ratio to the cadence calculation includes adding the L2P region search ratio to the garbage collection writes.

In Example 19, the subject matter of any of Examples 14-18, comprising: receiving a second write request; suspending the garbage collection operations in response to a threshold number of garbage collection operations having been performed on the physical block in a garbage collection cycle; and performing the second write request.

In Example 20, the subject matter of any of Examples 14-19, wherein the cadence calculation is a ratio between garbage collection writes and host writes, wherein the garbage collection writes are a count of garbage collection operations to move every valid page from the physical block to the new physical block, and wherein the host writes is a parameter that defines a count of host writes over which to spread the garbage collection writes.

In Example 21, the subject matter of any of Examples 14-20, wherein the block data structure is a bit map.

In Example 22, the subject matter of Example 21, wherein an entry in the data structure is a single bit.

In Example 23, the subject matter of Example 22, wherein a logical one in an entry indicates that an L2P region corresponding to a position of the bit includes a logical page that corresponded to the physical block.

In Example 24, the subject matter of any of Examples 14-23, wherein the data structure is written in the physical block.

In Example 25, the subject matter of any of Examples 14-24, wherein the NAND device includes a working memory, wherein the L2P table is larger than the working memory, and wherein an L2P region is not larger than the working memory.

In Example 26, the subject matter of Example 25, wherein searching the L2P table includes loading an L2P region into the working memory in response to a corresponding entry in the block data structure that indicates a logical page corresponded to the physical block.

Example 27 is a machine readable medium including instructions for controlling NAND operation latency, the instructions, when executed by processing circuitry of a machine, cause the processing circuitry to perform operations comprising: receiving a write request at a controller of a NAND device; calculating a number of garbage collection operations to perform on a physical block that is closed, the calculating including adding a logical-to-physical (L2P) region search ratio to a cadence calculation for garbage collection; performing the calculated number of garbage collection operations on the physical block, each garbage collection operation including, given a page in the physical block: searching an L2P table to determine whether the page is valid, the searching directed by a block data structure that includes an entry for each L2P table region, the entry indicating whether a logical page in the L2P table region corresponded to the physical block; and writing the page to a new physical block in response to the page being valid; and performing the write request in response to the calculated number of garbage collection operations being performed.

In Example 28, the subject matter of Example 27, wherein the L2P region search ratio has a numerator equal to a count of entries in the block data structure that indicate a logical page correspondence to the physical block.

In Example 29, the subject matter of Example 28, wherein the L2P region search ratio has a denominator equal to a load-threshold parameter.

In Example 30, the subject matter of Example 29, wherein the operations comprise: receiving a second write request; suspending the garbage collection operations in response to the count of entries in the block data structure being greater than the load-threshold parameter; and performing the second write request.

In Example 31, the subject matter of Example 30, wherein adding the L2P region search ratio to the cadence calculation includes adding the L2P region search ratio to the garbage collection writes.

In Example 32, the subject matter of any of Examples 27-31, wherein the operations comprise: receiving a second write request; suspending the garbage collection operations in response to a threshold number of garbage collection operations having been performed on the physical block in a garbage collection cycle; and performing the second write request.

In Example 33, the subject matter of any of Examples 27-32, wherein the cadence calculation is a ratio between garbage collection writes and host writes, wherein the garbage collection writes are a count of garbage collection operations to move every valid page from the physical block to the new physical block, and wherein the host writes is a parameter that defines a count of host writes over which to spread the garbage collection writes.

In Example 34, the subject matter of any of Examples 27-33, wherein the block data structure is a bit map.

In Example 35, the subject matter of Example 34, wherein an entry in the data structure is a single bit.

In Example 36, the subject matter of Example 35, wherein a logical one in an entry indicates that an L2P region corresponding to a position of the bit includes a logical page that corresponded to the physical block.

In Example 37, the subject matter of any of Examples 27-36, wherein the data structure is written in the physical block.

In Example 38, the subject matter of any of Examples 27-37, wherein the NAND device includes a working memory, wherein the L2P table is larger than the working memory, and wherein an L2P region is not larger than the working memory.

In Example 39, the subject matter of Example 38, wherein searching the L2P table includes loading an L2P region into the working memory in response to a corresponding entry in the block data structure that indicates a logical page corresponded to the physical block.

Example 40 is a system for controlling NAND operation latency, the system comprising: means for receiving a write request at a controller of a NAND device; means for calculating a number of garbage collection operations to perform on a physical block that is closed, the calculating including adding a logical-to-physical (L2P) region search ratio to a cadence calculation for garbage collection; means for performing the calculated number of garbage collection operations on the physical block, each garbage collection operation including, given a page in the physical block: means for searching an L2P table to determine whether the page is valid, the searching directed by a block data structure that includes an entry for each L2P table region, the entry indicating whether a logical page in the L2P table region corresponded to the physical block; and means for writing the page to a new physical block in response to the page being valid; and means for performing the write request in response to the calculated number of garbage collection operations being performed.

In Example 41, the subject matter of Example 40, wherein the L2P region search ratio has a numerator equal to a count of entries in the block data structure that indicate a logical page correspondence to the physical block.

In Example 42, the subject matter of Example 41, wherein the L2P region search ratio has a denominator equal to a load-threshold parameter.

In Example 43, the subject matter of Example 42, comprising: means for receiving a second write request; means for suspending garbage collection operations in response to the count of entries in the block data structure being greater than the load-threshold parameter; and means for performing the second write request.

In Example 44, the subject matter of Example 43, wherein the means for adding the L2P region search ratio to the cadence calculation includes adding the L2P region search ratio to the garbage collection writes.

In Example 45, the subject matter of any of Examples 40-44, comprising: means for receiving a second write request; means for suspending garbage collection operations in response to a threshold number of garbage collection operations having been performed on the physical block in a garbage collection cycle; and means for performing the second write request.

In Example 46, the subject matter of any of Examples 40-45, wherein the cadence calculation is a ratio between garbage collection writes and host writes, wherein the garbage collection writes are a count of garbage collection operations to move every valid page from the physical block to the new physical block, and wherein the host writes is a parameter that defines a count of host writes over which to spread the garbage collection writes.

In Example 47, the subject matter of any of Examples 40-46, wherein the block data structure is a bit map.

In Example 48, the subject matter of Example 47, wherein an entry in the data structure is a single bit.

In Example 49, the subject matter of Example 48, wherein a logical one in an entry indicates that an L2P region corresponding to a position of the bit includes a logical page that corresponded to the physical block.

In Example 50, the subject matter of any of Examples 40-49, wherein the data structure is written in the physical block.

In Example 51, the subject matter of any of Examples 40-50, wherein the NAND device includes a working memory, wherein the L2P table is larger than the working memory, and wherein an L2P region is not larger than the working memory.

In Example 52, the subject matter of Example 51, wherein the means for searching the L2P table include means for loading an L2P region into the working memory in response to a corresponding entry in the block data structure that indicates a logical page corresponded to the physical block.

Example 53 is at least one machine-readable medium including instructions that, when executed by processing circuitry, cause the processing circuitry to perform operations to implement of any of Examples 1-52.

Example 54 is an apparatus comprising means to implement of any of Examples 1-52.

Example 55 is a system to implement of any of Examples 1-52.

Example 56 is a method to implement of any of Examples 1-52.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell can be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device can be configured to provide wear cycle information to the memory device with each memory operation. The memory device control circuitry (e.g., control logic) can be programmed to compensate for memory device performance changes corresponding to the wear cycle information. The memory device can receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements can be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code can form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An apparatus comprising:
a NAND array;
an external interface;
a controller including:
a NAND interface to the NAND array;
a connection to the external interface; and
processing circuitry configured to:
initiate garbage collection on a portion of the NAND array via the NAND interface;
receive host writes from the external interface via the connection to the external interface;
determine a maximum number of garbage collection writes to the portion of the NAND array to host writes based on a load threshold, logical-to-physical (L2P) data structure regions involved in the garbage collection, and a number of the host writes;
perform, via the NAND interface, the maximum number of garbage collection writes; and
suspend the garbage collection to perform host writes; and
packaging to enclose the NAND array and the controller, the external interface providing communications through the packaging.

2. The apparatus of claim 1, wherein the L2P data structure regions involved in the garbage collection are recorded in a second data structure.

3. The apparatus of claim 2, wherein the second data structure is a bit map.

4. The apparatus of claim 3, wherein an entry in the second data structure is a single bit.

5. The apparatus of claim 4, wherein a logical one in an entry indicates that an L2P region corresponding to a position of the bit includes a logical page that corresponded to the portion of the NAND array.

6. The apparatus of claim 2, wherein the second data structure was written in a physical block on the portion of the NAND array.

7. The apparatus of claim 2, wherein the controller includes a working memory, wherein the L2P data structure is larger than the working memory, and wherein an L2P region is not larger than the working memory.

8. The apparatus of claim 7, wherein, to perform the maximum number of garbage collection writes, the processing circuitry of the controller is configured to load an L2P region into the working memory in response to a corresponding entry in the second data structure that indicates a logical page corresponded to a physical block in the portion of the NAND array.

9. The apparatus of claim 8, wherein, to perform the maximum number of garbage collection writes, the processing circuitry of the controller is configured to determine an L2P region search ratio to find the L2P region to load into working memory.

10. The apparatus of claim 9, wherein the L2P region search ratio has a numerator equal to a count of entries in the second data structure that indicate a logical page correspondence to the physical block.

11. The apparatus of claim 9, wherein the L2P region search ratio has a denominator equal to a load-threshold parameter.

12. The apparatus of claim 2, wherein, to determine the maximum number of garbage collection writes, the processing circuitry of the controller is configured to perform a cadence calculation that results in a ratio of garbage collection writes to host writes.

13. The apparatus of claim 12, wherein the garbage collection writes are a count of garbage collection writes to move every valid page from a physical block to a new physical block, and wherein the host writes are a parameter that defines a count of host writes over which to spread the garbage collection writes.

14. The apparatus of claim 12, wherein a number of L2P data structure regions involved with the portion of the NAND array are determined from a counter data structure.

15. The apparatus of claim 14, wherein entries in the counter data structure correspond to different portions of the NAND array, and wherein a value in an entry of the counter data structure is a count of L2P data structure regions that point to a corresponding portion of the NAND array.

16. The apparatus of claim 15, wherein, to determine the garbage collection cadence, the circuitry is configured to compute:

$$C = \frac{GCW_i + \frac{L2PC[i]}{L2PLoadThr}}{HW}$$

where, C is the garbage collection cadence, L2PC[i] is a value of a counter at index i in the counter data structure organized as an array, $GCW_i$ is the number of garbage collection writes for index i, L2PLoadThr is a parameter to adjust host latency, and HW is the number of host writes.

17. The apparatus of claim 14, wherein the portion of the NAND array is a block.

18. The apparatus of claim 17, wherein the counter data structure is stored in the block when the block is closed.

19. The apparatus of claim 1, wherein the external interface conforms to a Universal Flash Storage (UFS), Peripheral Component Interconnection Express (PCIe), Universal Serial Bus (USB), a Serial Advanced Technology Attachment (SATA), or an Embedded MultiMediaCard (eMMC) interface standard.

20. The apparatus of claim 1, wherein the NAND array includes a 3D NAND architecture.

* * * * *